United States Patent [19]
Chorey

[11] Patent Number: 6,151,509
[45] Date of Patent: *Nov. 21, 2000

[54] DUAL BAND CELLULAR PHONE WITH TWO POWER AMPLIFIERS AND A CURRENT DETECTOR FOR MONITORING THE CONSUMED POWER

[75] Inventor: Christopher M. Chorey, Newport Beach, Calif.

[73] Assignee: Conexant Systems, Inc., Newport Beach, Calif.

[*] Notice: This patent is subject to a terminal disclaimer.

[21] Appl. No.: 09/103,898

[22] Filed: Jun. 24, 1998

[51] Int. Cl.[7] .................................................. H04Q 7/20

[52] U.S. Cl. .................... 455/550; 455/102; 455/115; 455/126; 455/127; 455/129

[58] Field of Search ...................... 455/127, 115, 455/553, 102, 103; 330/126, 129

[56] References Cited

U.S. PATENT DOCUMENTS

| | | | |
|---|---|---|---|
| 5,732,330 | 3/1998 | Anderson et al. | 455/84 |
| 5,774,017 | 6/1998 | Adar . | |
| 5,794,159 | 8/1998 | Portin | 455/553 |
| 5,884,149 | 3/1999 | Jaakola | 455/103 |
| 5,887,020 | 3/1999 | Smith et al. | 375/200 |

FOREIGN PATENT DOCUMENTS

| | | |
|---|---|---|
| 481 807 A2 | 4/1992 | European Pat. Off. . |
| 772 292 A2 | 5/1997 | European Pat. Off. . |
| 859 464 A2 | 8/1998 | European Pat. Off. . |
| WO 99/25064 | 5/1999 | WIPO . |

OTHER PUBLICATIONS

Specification: GSM Technical Specification GSM 05.05; Jul. 1996; Version 5.2.0.; Entitled Digital celluar telecommunications systems (Phase 2+); Radio transmission and reception; European Telecommunications Institute pp. 8, 11, 14 and 33.

Lawrence J. Curran, "RFICs: Dual–Band Cell Phones Emerge"; *EDN;* May 22, 1997; pp. 21, 22, 24.

Datasheet; "RF230 GSM1800/PC1900 Power Amplifier"; Rockwell Semiconductor Systems; Jan. 14, 1998.

"Track to Multi–band GSM"; Symbionics; *Wireless Week;* Jun. 30, 1997.

Datasheet; "RF122 Power Amplifier Controller for Heterojunction Bipolar Transistor Power Amplifiers"; Rockwell Semiconductor Systems; Oct. 13, 1997.

Datasheet; "RF130 Power Amplifier for GSM applications"; Rockwell Semiconductor Systems; Dec. 3, 1997.

Fink, Christiansen et. al; *Electronics Engineers' Handbook;* pp. 25–66–25–70.

*Primary Examiner*—Daniel S. Hunter
*Assistant Examiner*—Yemane Woldetatios
*Attorney, Agent, or Firm*—Knobbe, Martens, Olson & Bear, LLP

[57] ABSTRACT

A transmitter for a cellular phone comprising an antenna and being operable at a first radio frequency band and a second radio frequency band is disclosed. The transmitter comprises a first power amplifier and a second power amplifier. The first power amplifier has a first input for a first signal at the first radio frequency band, a second input for a first control signal and a first output for an amplified first signal. The first output is connectable to the antenna. The second power amplifier has a third input for a second signal at the second radio frequency band, a fourth input for a second control signal and a second output for an amplified second signal. The second output is connectable to the antenna. The transmitter further comprises a single control module which receives a signal indicative of a current an active power amplifier draws. The control module uses this signal indicating the drawn current to generate a control signal to control the active power amplifier.

19 Claims, 5 Drawing Sheets

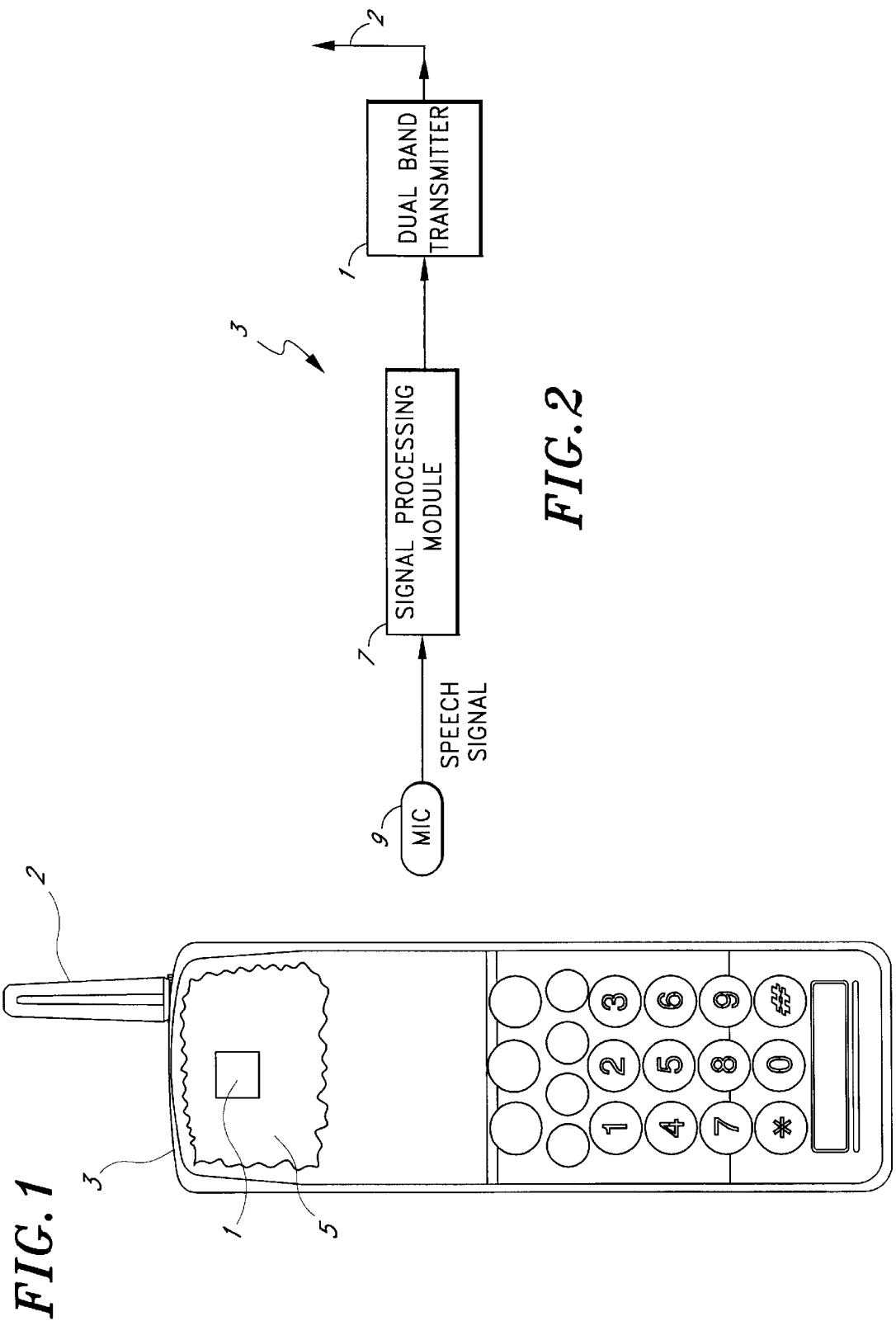

DUAL BAND CELLULAR PHONE WITH TWO POWER AMPLIFIERS AND A CURRENT DETECTOR FOR MONITORING THE CONSUMED POWER

BACKGROUND OF THE INVENTION

The invention relates to cellular phones used in mobile communications systems. More particularly, the invention relates to a circuit and a method for controlling electrical characteristics of a signal transmitted by a dual band cellular phone.

Usually, cellular phones are designed to operate within the environment of one of several mobile communications networks. One example of such an environment is a mobile communications network according to a standard known as GSM (Global System for Mobile communications) created by the European Telecommunications Standards Institute (ETSI). In GSM, there is an assigned frequency band around 900 MHz for Standard GSM, and an assigned frequency band around 1800 MHz for DCS1800 (Digital Communications System, DCS) which can be considered to be a further mobile communications environment. Other environments include systems known as Advanced Mobile Phone System (AMPS) operating in a frequency band around 800 MHz, and as Personal Communications System (PCS) operating in a frequency band around 1900 MHz.

As the number of users of cellular phones increases, some operators have added capacity to their networks by including more than only one frequency band in their networks. In the case of the GSM system, for example, the frequency bands around 900 MHz and 1800 MHz are now used to expand the capacities of certain networks.

Manufacturer of cellular phones, therefore, are developing a new generation of cellular phones which are operable at, for example, two frequency bands. A cellular phone operable at two frequency bands is referred to as a dual band cellular phone. As the dual band cellular phone has to transmit signals at both frequency bands, duplication of functions is required. Duplication of functions, however, leads to higher manufacturing costs and ultimately to higher prices for the dual band cellular phones.

SUMMARY OF THE INVENTION

There is therefore a need to keep the complexity of dual band cellular phones and their manufacturing costs caused by the duplication as low as possible. Further, there is a need to minimize size of dual band cellular phones because users have come to expect single band cellular phones to be small and to have an attractive design.

An aspect of the invention involves a transmitter for a cellular phone comprising an antenna and being operable at a first radio frequency band and a second radio frequency band. The transmitter comprises a first power amplifier and a second power amplifier. The first power amplifier has a first input for a first signal at the first radio frequency band, a second input for a first control signal, a final amplification stage and a first output for an amplified first signal. The first output is connectable to the antenna. A first detector is associated with the final amplification stage of the first power amplifier. When the first power amplifier is active, the first detector generates a first detection signal which is indicative of an electrical power consumed by the final amplification stage of the active first power amplifier.

The second power amplifier has a third input for a second signal at the second radio frequency band, a fourth input for a second control signal, a final amplification stage and a second output for an amplified second signal. The second output is connectable to the antenna. A second detector is associated with the final amplification stage of the second power amplifier. When the second power amplifier is active, the second detector generates a second detection signal which is indicative of an electrical power consumed by the final amplification stage of the active second power amplifier.

A control module is associated with the first and second detectors and generates a control signal to control one of the power amplifiers at a time. The control signal being a function of one of the first and second detector signals and a reference signal.

Another aspect of the invention involves a cellular phone operable at a first radio frequency band and a second radio frequency band. The cellular phone comprises a transmitter having first and second power amplifiers, detectors which generate signals which are indicative of the electrical power a final amplification stage of an active power amplifier consumes, and a single control module which controls both power amplifiers.

An additional aspect of the invention involves a method for controlling electrical characteristics of a signal transmitted by a dual band cellular phone. The method comprises the step of providing a dual band transmitter comprising a single control module, and first and second power amplifiers which are connected to an antenna. One of the first and second power amplifiers is activated and an RF signal is fed to the activated power amplifier. The activated power amplifier amplifies the RF signal and feeds the amplified RF signal to the antenna. An electrical characteristic which is indicative of the power consumed by the activated power amplifier is measured. The electrical characteristic is fed to the single control module, and compared with a reference signal to generate a control signal for the activated power amplifier. The control signal is fed to the activated power amplifier to maintain the amplified RF signal in accordance with a desired signal characteristic defined by the reference signal.

In an embodiment of the present invention, the electrical characteristic indicative of the consumed power is a current drawn by the active power amplifier. Detecting the drawn current rather than the radio frequency output or input permits the use of a single detection circuit and removes the need for radio frequency power detectors. Accordingly, the present invention both reduces detection complexity and eliminates circuitry.

BRIEF DESCRIPTION OF THE DRAWINGS

The above-mentioned and other features of the invention will now be described with reference to the drawings of a preferred embodiment of the power control circuit comprised in a dual band cellular phone. In the drawings, the same components have the same reference numerals. The illustrated embodiment is intended to illustrate, but not to limit the invention. The drawings contain the following figures:

FIG. 1 is a schematic illustration of a cellular phone cut away to show a portion of the motherboard;

FIG. 2 is a simplified illustration of a transmit path of the cellular phone shown in FIG. 1;

DETAILED DESCRIPTION OF THE PREFERRED EMBODIMENT

Figure 3A:
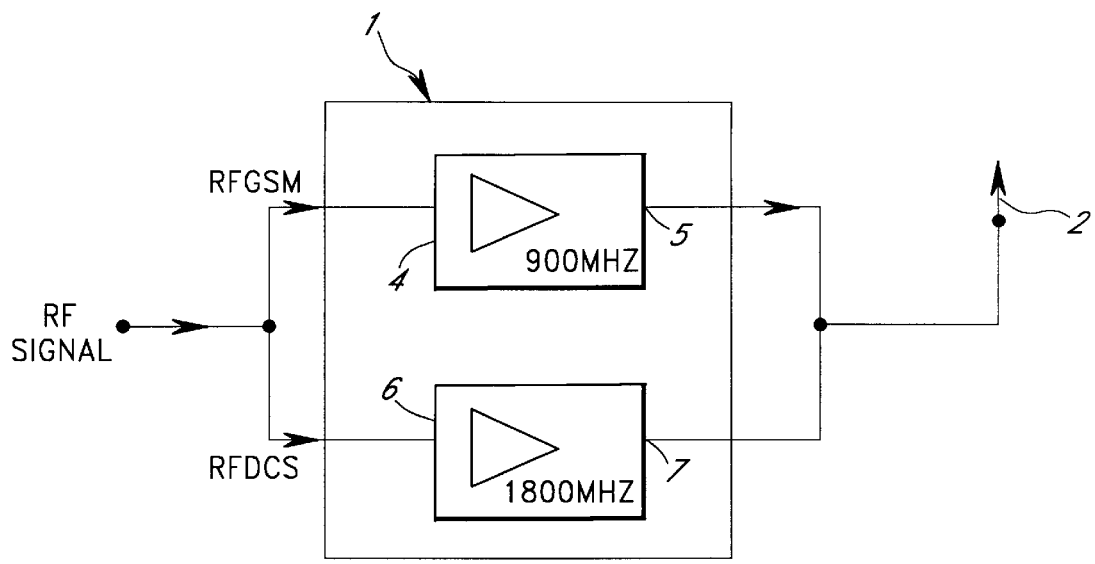
FIG. 3A is a schematic illustration of a dual band transmitter for a cellular phone.

A mobile communications system, for example according to the GSM standard, is structured to have a variety of individual regions called cells, and to comprise a variety of fixed transmitter stations called base stations, and a plurality of mobile stations, the cellular phones. Usually, one base station defines one cell and handles telephone traffic to and from cellular phones which are currently located in the cell.

FIG. 1 schematically illustrates a dual band cellular phone 3 made in accordance with the invention including an antenna 2. A portion of the case of the dual band cellular phone 3 is cut away to show a motherboard 5 of the cellular phone 3 with a dual band transmitter 1 positioned thereon. Although not shown in FIG. 1, those skilled in the art will appreciate that the cellular phone 3 comprises a plurality of other components and functional modules, such as the components of a receive path and a transmit path. The cellular phone 3 further includes a display and a keypad.

The receive path of such a dual band cellular phone 3 includes a radio frequency (RF) receiver, an analog-to-digital converter, a demultiplexer and a demodulator. The transmit path comprises a multiplexer, modulator, digital-to-analog converter and an RF transmitter. Further functional modules include, for example, a channel coder/decoder and a speech coder/decoder. Both the RF receiver and the RF transmitter are usually connected to the antenna 2 by means of a diode switch which connects the antenna 2 either to the RF receiver or to the RF transmitter.

The RF transmitter comprises an amplifier stage for amplifying the RF signals according to electrical characteristics, for example, a defined power level versus time profile and a defined spectral mask, before the RF signals are fed to the antenna 2 and emitted as radio signals. The spectral mask and the power level versus time profile are defined in GSM Technical Specification GSM 05.05, July 1996, Version 5.2.0, entitled "Digital cellular telecommunications system (Phase 2+); Radio transmission and reception", Paragraph 4.2.2, and Annex B.

FIG. 2 illustrates a simplified embodiment of the transmit path of the dual band cellular phone 3. Within the cellular phone 3, a processing module 7 and the dual band transmitter 1 including two power amplifiers are positioned on the motherboard and interconnected between the antenna 2 and a microphone 9 of the cellular phone 3. In this simplified illustration, the processing module 7 performs most speech and signal processing in a transmit direction, for example, voice encoding and channel encoding. The signal processing further includes modulating an RF carrier of either 900 MHz or 1800 MHz in the present embodiment with the processed speech signal.

FIG. 3A shows a simplified block diagram of the dual band transmitter 1 shown in FIG. 1. The dual band transmitter 1 includes two power amplifiers 4, 6 connected to the antenna 2. The power amplifiers 4, 6 receive an RF signal from an RF signal source (not shown) located within the cellular phone 3. For instance, the RF signal source may be included in the processing module 7 shown in FIG. 2. In the illustrated embodiment, the RF carrier advantageously has a frequency of 900 MHz or 1800 MHz depending on which RF carrier (GSM900 or DCS 1800) is chosen.

The power amplifiers 4, 6 are associated with a controller (not shown) located on the motherboard 5 shown in FIG. 1. This controller monitors and controls the power amplifiers 4, 6 to ensure that an amplified RF signal output from an activated power amplifier 4, 6 conforms, for example, with the defined output power level versus time profile (GSM 05.05). The controller compares the power of the RF signal fed to the antenna 2 with a reference signal and generates a control signal to control. the active power amplifier 4, 6. Thereby, the active power amplifier 4, 6 and the controller form a feedback control loop, for example, a second order type 1 control loop.

In the illustrated embodiment, the power amplifier 4 operates at a frequency band around 900 MHz, and the power amplifier 6 operates at a frequency band around 1800 MHz. The power amplifier 4 may advantageously be the same as a power amplifier device RF 130 available from Rockwell Semiconductor Systems as Order No. W229. The integrated amplifier circuit of the power amplifier device includes a three-stage amplifier with heterojunction bipolar transistors in Gallium Arsenide (GaAs) technology. The power amplifier 6 may advantageously be the same as a power amplifier device RF230 available from Rockwell Semiconductor Systems as Order No. W225. The integrated amplifier circuit of the power amplifier 6 also includes a three-stage amplifier with heterojunction bipolar transistors in Gallium Arsenide (GaAs) technology. Those skilled in the art will appreciate that other power amplifiers operating at these frequency bands can be used.

The power amplifier 4 receives an RF signal RFGSM, and the power amplifier 6 receives an RF signal RFDCS. However, those skilled in the art will appreciate that the power amplifiers 4, 6 can operate at another pair of frequency bands, for example, 900/1900 MHz. Because the cellular phone 3 can operate at the two frequencies, it is referred to as a dual band cellular phone. However, it is contemplated that only one power amplifier 4, 6 is active at a time.

Although the specific embodiments of the dual band transmitter 1 are described with reference to a dual band cellular phone, it is further contemplated that the invention is also applicable to cellular phones which can operate at more than two different frequency bands. These frequency bands may include those assigned for AMPS or PCS, or newly assigned frequency bands for mobile communications systems.

Which frequency band the cellular phone 3 uses to communicate with the base station is determined by external factors. That is, a user may deliberately set the cellular phone to operate in one of the two frequency bands depending on the mobile communications system (GSM900, DCS1800, GSM1900) the user chooses. Alternatively, the frequency band of the cellular phone 3 can be determined by the base station which currently serves the cellular phone 3. Depending on the current telephone traffic in the cell served by the base station, a dynamic change of the frequency band may be necessary to allow more telephone traffic. In this case, the base station causes the cellular phone 3 to operate in one of the two frequency bands.

Figure 3B:
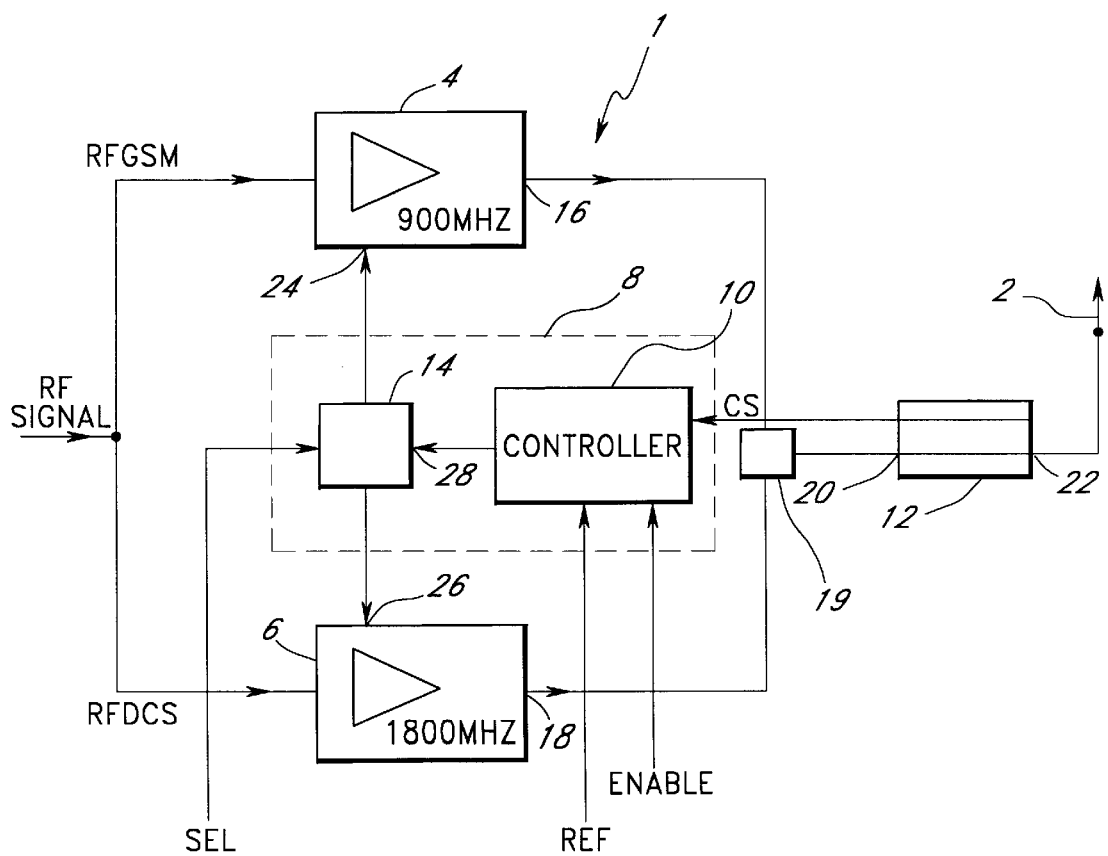
FIG. 3B is a schematic illustration of a first embodiment of a dual band transmitter for a cellular phone made in accordance with the present invention.

FIG. 3B shows a block diagram of a first embodiment of the dual band transmitter shown in FIG. 3A associated with a control module. An output 16 of the power amplifier 4 is connected to a first input of a diplexer 19, and an output 18 of the power amplifier 6 is connected to a second input of the diplexer 19. An output of the diplexer 19 is connected to an input 20 of an RF coupler 12, and an output 22 of the RF coupler 12 is connected to the antenna 2. Accordingly, each power amplifier 4, 6 can be connected to the antenna 2 via the diplexer 19. The diplexer 19 connects only one of the power amplifiers 4, 6 at a time to the RF coupler 12, and prevents that an RF signal from an active power amplifier 4, 6 is fed to the output 16, 18 of the inactive power amplifier 4, 6.

The dual band transmitter 1 further includes a control module 8 which controls the power amplifiers 4, 6 so that, for example, the prescribed power level versus time profile as defined in the GSM standard (GSM 05.05) is achieved and maintained. For illustrative purposes, the control module 8 is shown as having a switch 14 and a controller 10. However, those skilled in the art will appreciate that the illustrated division of the control module 8 is random and that other divisions are possible. The switch 14, which is controllable through an electrical signal, is connected to an input 24 of the power amplifier 4 and to an input 26 of the power amplifier 6. The control module 8 receives input signals and generates an output signal which is fed to an input 28 of the switch 14. The signals which the control module 8 receives include a signal ENABLE, a reference signal REF and a coupled RF signal CS. Besides the signal from the controller 10, the switch 14 receives a control signal SEL which operates the switch 14 between a first and second switch state to allow control of either the power amplifier 4 or the power amplifier 6. Preferably, the switch 14 is an electronic switch such as a diode switch.

In the illustrated preferred embodiment of the transmitter 1, the power amplifiers 4, 6 are controlled by a single control module 8. Thus, the power amplifiers 4, 6 share one control module 8 so that no duplication of control circuits is necessary resulting in cost savings for dual band cellular phones. By means of the control signal SEL, the control module 8 controls either the power amplifier 4 air 6. Thus, the control module 8 is part of two separate feedback control loops.

The RF coupler 12, for example, is a directional coupler which couples a portion CS, for instance −20 dB of a GSM signal and −15 dB of a DCS signal, of the amplified RF signal out and inputs this coupled portion CS of the amplified RF signal to the controller 10. Therefore, when the power level of the amplified RF signal changes, the power level of the portion CS changes also. Advantageously, the RF coupler 12 is made of two adjacent microstrips. The first microstrip is part of a trace connecting, via the diplexer 19, the power amplifiers 4, 6 and the antenna 2 and guiding the amplified RF signal. A portion of the amplified RF signal couples from the first microstrip to the second microstrip. This portion constitutes the coupled portion CS as stated above. The second microstrip guides the portion CS to the controller 10. The coupling efficiency of such an RF coupler 12 is determined by a spacing between the two microstrips and a length of the second microstrip with respect to the first microstrip. The second microstrip is on one end terminated with 50 ohms. At the end of the second microstrip, which is associated with the diplexer 19, a resistive attenuator and a filtering circuit are interposed between the coupler 12 and the controller 10. The attenuator and the filtering circuit adjust the power level and the frequency response of the coupler signal CS.

As stated above, the frequency band which the cellular phone uses to communicate with the base station is determined by external factors. An internal central controller (not shown) of the cellular phone 3 selects the RF carrier and generates the control signal SEL depending on these external factors. The control signal SEL controls the switch 14 to connect the controller 10 to the power amplifier 4 or to the power amplifier 6. As soon as the controller 10 is connected to one of the power amplifiers 4, 6 the respective power amplifier 4, 6 is activated while the other power amplifier 4, 6 remains deactive or is deactivated.

Figure 4:
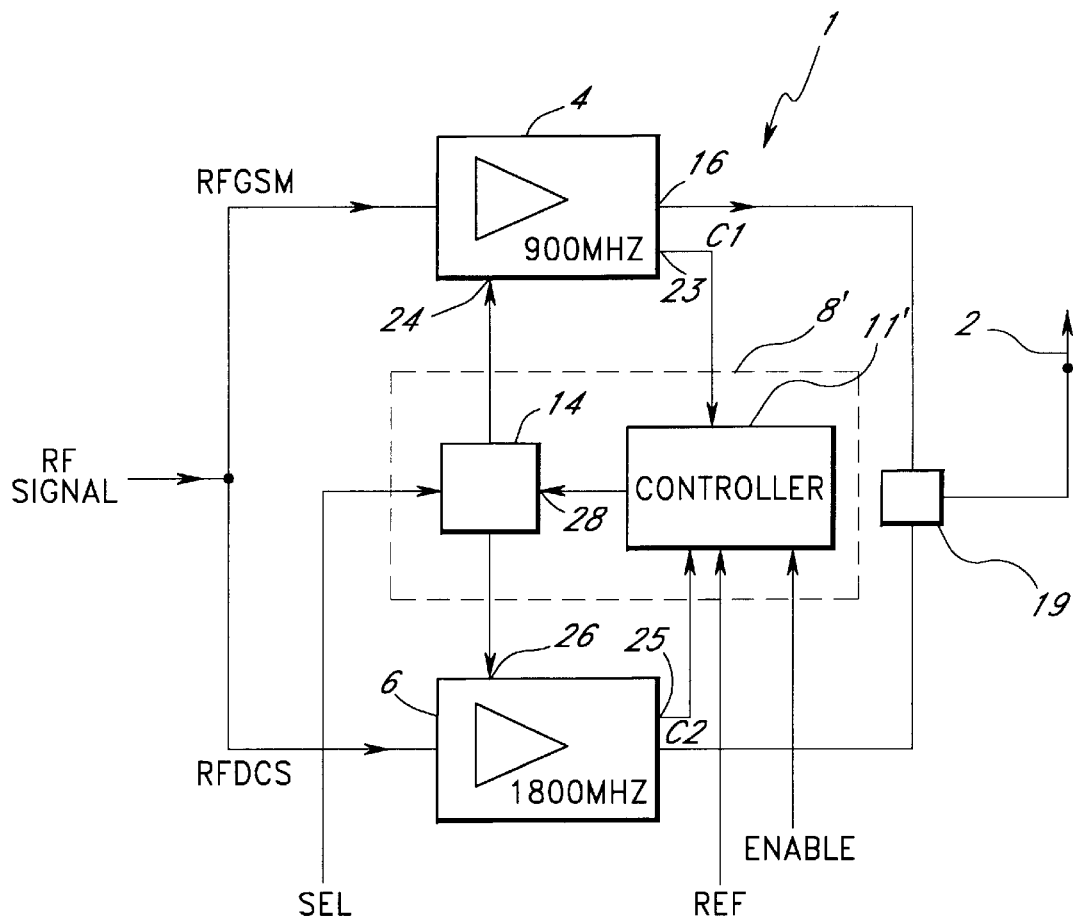
FIG. 4 is a block diagram of a second embodiment of a dual band transmitter for a cellular phone made in accordance with the present invention.
Figure 5:
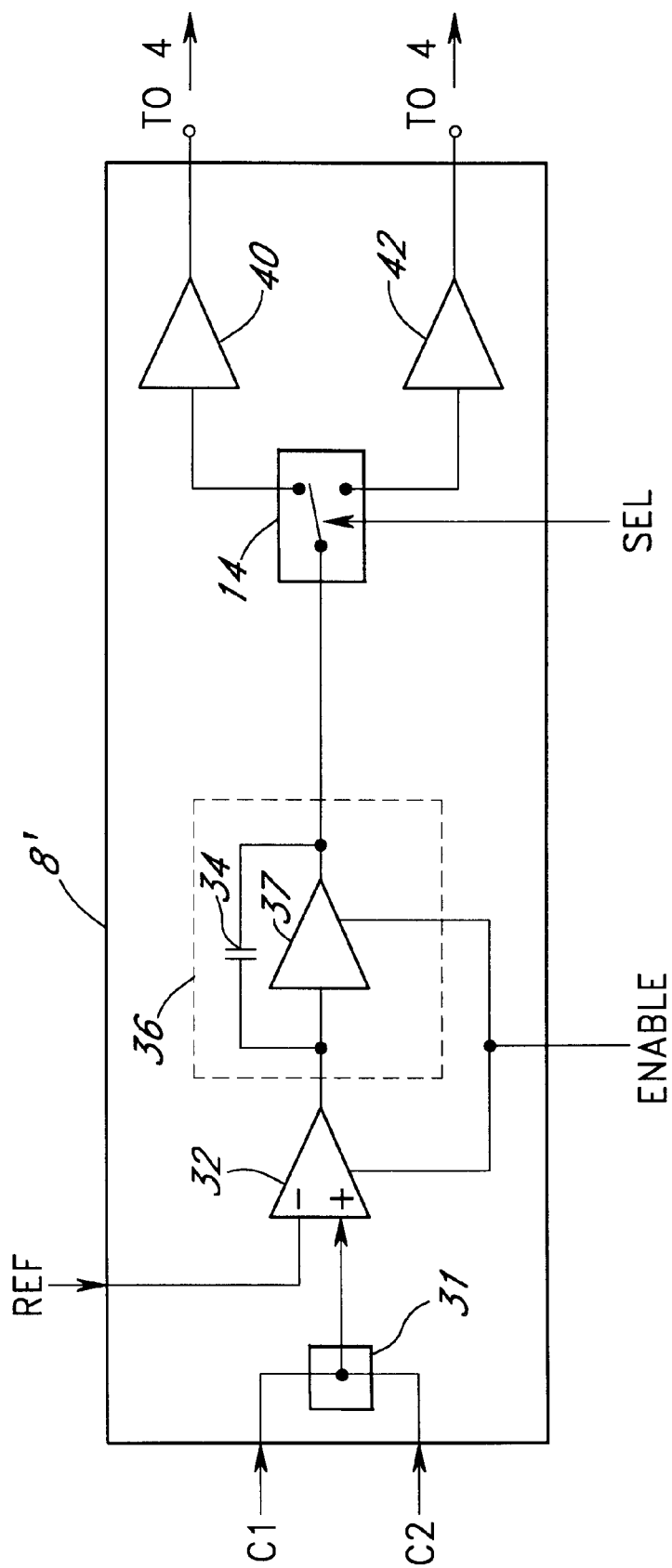
FIG. 5 is a block diagram of an embodiment of a control module included in the dual band transmitter of FIG. 4.
Figure 6:
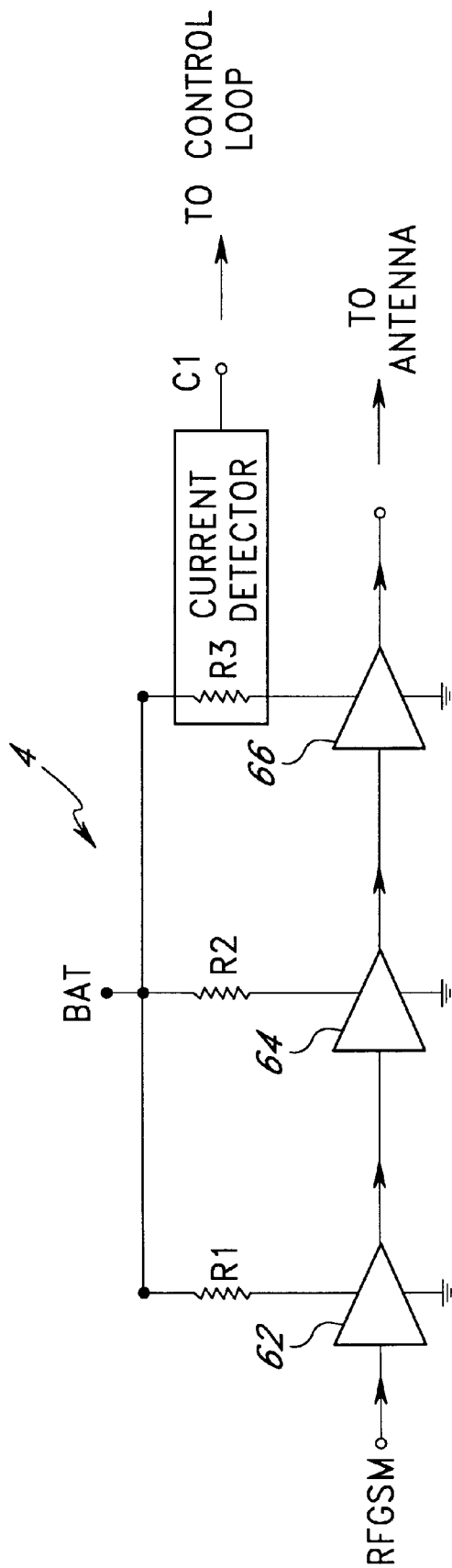
FIG. 6 is a block diagram of a power amplifier included in the second embodiment of the dual band transmitter.

As it is known in the art, there are two electrical specifications in signal transmission, single-ended and differential. The single-ended version uses a single line for each signal, referenced to a common ground. The differential version uses a pair of lines, sometimes referred to as "positive" and "negative", to differentiate actual signals from noise. Those skilled in the art will appreciate that the components of the control module 8 can be implemented in the single-ended version or the differential version depending on the requirements regarding noise. FIGS. 4, 5 and 6, therefore, show embodiments in the single-ended version for illustrative purposes. However, it is contemplated that the two versions are equivalent.

FIG. 4 shows a block diagram of a second embodiment of the dual bend transmitter 1 shown in FIG. 3B. The second embodiment of the dual band transmitter 1 has a structure which is similar to the structure of the first embodiment of the dual band transmitter 1. Therefore, regarding a description of the general structure of the second embodiment reference is made to the description of FIG. 3B.

A controller 11' which is part of a control module 8' controls the switch 14 as described with reference to FIG. 3B. The control module 8' also receives the control signals SEL, REF and ENABLE.

In this second embodiment, the controller 11' receives control signals C1, C2 which originate from the power amplifiers 4, 6, respectively. The control signal C1 is indicative of a current drawn by a final amplification stage of an active power amplifier 4, which is shown in FIG. 6 in greater detail. This current is an accurate indication of the RF power transmitted by the power amplifier 4. As long as the output impedance of the power amplifier 4 is constant, this measurement of the transmitted RF power is essentially independent from the radio frequency.

Correspondingly, the control signal C2 is indicative of a current drawn by a final amplification stage of the power amplifier 6. It is contemplated that only an active power amplifier 4, 6 generates one of these control signals C1, C2 so that only one control signal C1, C2 is available at a time.

Referring to FIGS. 4, 5, the outputs 23, 25 of the power amplifiers 4, 6, respectively, are connected to a switch 31 within the control module 8'. Because only one control signal C1, C2 is available at a time, only one control signal C1, C2 is output from the switch 31 and input to a differential amplifier 32. Preferably, the switch 31 is electrically controllable, for example, a diode switch.

Besides one of the control signals C1, C2, the control module 8' receives control signals REF, SEL and ENABLE. The control module 8' comprises a serial arrangement of the differential amplifier 32, an integrator 36, a switch 14 and one of two driver amplifiers 40, 42.

The differential amplifier 32 compares one of the control signals C1, C2 with a voltage of the control signal REF and outputs an error signal (voltage) which is proportional to the difference (error) between the signals C1, C2 and REF. The reference signal REF has a shape which corresponds to the "ideal" power level versus time profile. Thus, the ideal and the actually emitted power level versus time profiles are compared.

The integrator 36 comprises an operational amplifier 37 and a capacitor 34 which determines a time constant of the integrator 36. For example, the time constant is about 1 millisecond which corresponds to a cut-off frequency of about 1 kHz. The integrator 36 outputs a signal which corresponds to the accumulated difference between the control signal REF and the selected control signal C1, C2, i.e., the error signal. It is contemplated that a positive error (i.e, the reference signal REF is larger than the detected control signal C1, C2) is added to, and that a negative error (i.e., the reference signal REF is smaller than the detected control signal C1, C2) is subtracted from the accumulated error signal.

The integrator 36 is connected to the switch 14 which is controlled by the control signal SEL. Depending on the position of the switch 14, the signal output from the integrator 36 is either input to the driver amplifier 40 for GSM900 operation or input to the driver amplifier 42 for DCS1800 operation. The driver amplifier 40 is connected to the power amplifier 4, and the driver amplifier 42 is connected to the power amplifier 6. The driver amplifiers 40, 42 output signals, drive currents, to control the respective power amplifiers 4, 6. For instance, an increasing signal controls the power amplifier 4, 6 to increase the power level of the amplified RF signal. For instance, the driver amplifier 40 allows a maximal drive current of about 100 milliamperes in case a Rockwell RF130 power amplifier 4 is used, and the driver amplifier 42 allows a maximum drive current of about 80 milliamperes in case a Rockwell RF230 power amplifier 6 is used. The driver amplifiers 40, 42, therefore, limit the drive currents to upper limits to avoid excessive heating of the power amplifiers 4, 6.

The control module 8' has two switchable outputs which allows to provide two separate current limits for the power amplifiers 4, 6. Because the control module 8 is switchable, it is part of two feedback control loops, each including one power amplifier 4, 6. The control module 8', therefore, adjusts each loop gain independently.

A schematic illustration of a power amplifier 4 is shown in FIG. 6. The power amplifier 4 comprises three cascaded amplification stages 62, 64, 66, which are advantageously transistor stages, such as in the power amplifier devices RF130, RF230 available from Rockwell Semiconductor Systems. Other conventional power amplifiers are also acceptable. The first amplification stage 62 receives an RF signal, for example, the signal RFGSM as shown in FIG. 4. The third amplification stage 66 outputs an amplified RF signal and feeds it to the antenna 2. Each amplification stage 62, 64, 66 is connected to a battery terminal BAT via a resistor R1, R2, R3, respectively. The resistors R1, R2, R3 represent supply traces leading to the amplification stages 62, 64, 66. The current drawn can be determined by measuring the voltage drop in the supply traces, i.e., across the resistor R3, leading to the final amplification stage 66. The power level of the amplified RF signal is proportional to the drawn current, so that a certain value of drawn current corresponds to a certain power level of the amplified RF signal.

In addition to the advantage of sharing a common control module 8' by the power amplifiers 4, 6, the second embodiment of the dual band transmitter 1 allows to overcome difficulties in sampling, as the RF power level is not directly sampled but inferred from a low frequency/DC current measurement. This also removes a need for a radio frequency detector circuit. Thus, measuring the drawn current provides a simple method of detecting the power level of an emitted RF signal and to use the drawn current in a power control circuit in a dual band cellular phone.

Although this invention has been described in terms of certain preferred embodiments, other embodiments that are apparent to those of ordinary skill in the art are also within the scope of this invention. Accordingly, the scope of the invention is intended to be defined by the claims that follow.

What is claimed is:

1. A cellular phone for a mobile communications system, said cellular phone being operable at a first radio frequency band and a second radio frequency band comprising a dual band transmitter, a power supply and an antenna, said dual band transmitter comprising:

a first power amplifier couoled to said power supply, said first power amplifier having a first input for a first signal at said first radio frequency band, a second input for a first control signal, a final amplification stage and a first output for an amplified first signal, said first output being connectable to said antenna;

a first detector, said first detector being associated with said power supply and the final amplification stage of said first power amplifier and generating a first detection signal indicative of power drawn by the final amplification stage of said first power amplifier from said power supply when said first power amplifier is active;

a second power amplifier coupled to said power supply, said second power amplifier having a third input for a second signal at said second radio frequency band, a fourth input for a second control signal, a final amplification stage and a second output for an amplified second signal, said second output being connectable to said antenna;

a second detector, said second detector being associated with said power supply and the final amplification stage of said second power amplifier and generating a second detection signal indicative of power drawn by the final amplification stage of said second power amplifier from said power supply when said second power amplifier is active; and a control module, said control module being associated with said first and second detectors and generating a control signal to control one of said power amplifiers, said control signal being a function of one of said first and second detection signals and a reference signal.

2. The cellular phone of claim 1, wherein said first radio frequency band is about 900 MHz, and said second radio frequency band is about 1800 MHz.

3. The cellular phone of claim 1, wherein said first radio frequency band is about 900 MHz, and said second radio frequency band is about 1900 MHz.

4. The cellular phone of claim 1, wherein said control module comprises:

a differential amplifier, said differential amplifier having a third input for receiving a reference signal and having a fourth input for one of said first and second detection signals, and generating an error signal corresponding to a difference between said reference signal and said detection signal;

an integrator, said integrator integrating said error signal and generating an integrated error signal; and a shaping circuit, said circuit weighing said integrated error signal in accordance with characteristics of said first and second power amplifiers to generate said control signal which equalizes nonlinear amplification characteristics of said power amplifiers.

5. The cellular phone of claim 4, wherein said control module further comprises a switch, said switch being controllable and feeding said control signal to one of said power amplifiers.

6. The cellular phone of claim 5, wherein said control module further comprises a first amplifier and a second amplifier, said first amplifier being connected to a first terminal of said switch and driving said first power amplifier, and said second amplifier being connected to a second terminal of said switch and driving said second power amplifier.

7. The cellular phone of claim 1, wherein said first and second detectors comprise a detector responsive to the input current of the first and second power amplifier.

8. A transmitter for a cellular phone comprising an antenna and being operable at a first radio frequency band and a second radio frequency band, said transmitter comprising:

a first power amplifier coupled to a power supply, said first power amplifier having a first input for a first signal at said first radio frequency band, a second input for a first control signal, a final amplification stage and a first output for an amplified first: signal, said first output being connectable to said antenna;

a first detector, said first detector being associated with said power supply and the final amplification stage of said first power amplifier and generating a first detection signal indicative of power drawn by the final amplification stage of said first power amplifier from said power supply when said first power amplifier is active;

a second power amplifier coupled to said power supply, said second power amplifier having a third input for a second signal at said second radio frequency band, a fourth input for a second control signal, a final amplification stage and a second output for an amplified second signal, said second output being connectable to said antenna;

a second detector, said second detector being associated with said power supply and the final amplification stage of said second power amplifier and generating a second detection signal indicative of power drawn by the final amplification stage of said second power amplifier from said power supply when said second power amplifier is active; and a control module, said control module being associated with said first and second detectors and generating a control signal to control one of said power amplifiers, said control signal being a function of one of said first and second detector signals and a reference signal.

9. The transmitter of claim 8, wherein said control module comprises:

a differential amplifier, said differential amplifier having a third input for receiving a reference signal and having a fourth input for one of said detection signal, and generating an error signal corresponding to a difference between said reference signal and said detection signal;

an integrator, said integrator integrating said error signal and generating an integrated error signal; and a shaping circuit, said circuit weighing said integrated error signal in accordance with characteristics of said first and second power amplifiers to generate said control signal which equalizes nonlinear amplification characteristics of said power amplifiers.

10. The transmitter of claim 9, wherein said control module further comprises a switch, said switch being controllable and feeding said control signal to one of said power amplifiers.

11. The transmitter of claim 8, wherein said control module further comprises a first amplifier and a second amplifier, said first amplifier being connected to a first terminal of said switch and driving said first power amplifier, and said second amplifier being connected to a second terminal of said switch and driving said second power amplifier.

12. The transmitter of claim 8, wherein said detector comprises a current sensor which monitors the current of at least one stage of said first and second power amplifier.

13. The transmitter of claim 12, wherein said detector comprises first and second detector associated with said first and second power amplifier.

14. A method for controlling an output power level of a dual band cellular phone, comprising the steps of:

providing a dual band transmitter comprising a single control module, and first and second power amplifiers which are coupled to a power supply and connected to an antenna;

activating one of said first and second power amplifiers;

feeding an RF signal to said activated power amplifier;

amplifying said RF signal with said activated power amplifier;

feeding said amplified RF signal to said antenna;

measuring an electrical characteristic of said activated power amplifier, said characteristic being indicative of the power drawn by said activated power amplifier from said power supply;

feeding said electrical characteristic to said single control module;

comparing said electrical characteristic with a reference signal to generate a control signal for said activated power amplifier; and feeding said control signal to the activated power amplifier to control the activated power amplifier to provide an amplified RF signal which is in accordance with a desired signal characteristic defined by the reference signal.

15. A cellular phone for a mobile communications system, said cellular phone being, operable at a first radio frequency band and a second radio frequency band comprising a dual band transmitter, a power supply and an antenna, said dual band transmitter comprising:

a first power amplifier, said first power amplifier having a first input for a first signal at said first radio frequency band, a second input for a first control signal, a final amplification stage and a first output for an amplified first signal, said first output being connectable to said antenna;

a first detector, said first detector being associated with the final amplification stage of said first power amplifier and generating a first detection signal indicative of power consumed by the final amplification stage of said first power amplifier when said first power amplifier is active;

a second power amplifier, said second power amplifier having a third input for a second signal at said second radio frequency band, a fourth input for a second control signal, a final amplification stage and a second output for an amplified second signal, said second output being connectable to said antenna;

a second detector, said second detector being associated with the final amplification stage of said second power amplifier and generating a second detection signal indicative of power consumed by the final amplification stage of said second power amplifier when said second power amplifier is active; and a control module, said control module being associated with said first and second detectors and generating a control signal to control one of said power amplifiers, said control signal being a function of one of said first and second detection signals and a reference signal, the control module comprising:

a differential amplifier, said differential amplifier having a third input for receiving a reference signal and having a fourth input for one of said first and second detection signals, and generating an error signal corresponding to a difference between said reference signal and said detection signal;

an integrator, said integrator integrating said error signal and generating an integrated error signal; and a shaping circuit, said circuit weighing said integrated error signal in accordance with characteristics of said first and second power amplifiers to generate said control signal which equalizes nonlinear amplification characteristics of said power amplifiers.

16. The cellular phone of claim 15, wherein said control module further comprises a switch, said switch being controllable and feeding said control signal to one of said power amplifiers.

17. The cellular phone of claim 16, wherein said control module further comprises a first amplifier and a second amplifier, said first amplifier being connected to a first terminal of said switch and driving said first power amplifier, and said second amplifier being connected to a second terminal of said switch and driving said second power amplifier.

18. A transmitter for a cellular p comprising an antenna and being operable at a first radio frequency band and a second radio frequency band, said transmitter comprising:

a first power amplifier, said first power amplifier having a first input for a first signal at said first radio frequency band, a second input for a first control signal, a final amplification stage and a first output for an amplified first signal, said first output being connectable to said antenna;

a first detector, said first detector being associated with the final amplification stage of said first power amplifier and generating a first detection signal indicative of power consumed by the final amplification stage of said first power amplifier when said first power amplifier is active;

a second power amplifier, said second power amplifier having a third input for a second signal at said second radio frequency band, a fourth input for a second control signal, a final amplification stage and a second output for an amplified second signal, said second output being connectable to said antenna;

a second detector, said second detector being associated with the final amplification stage of said second power amplifier and generating a second detection signal indicative of power consumed by the final amplification stage of said second power amplifier when said second power amplifier is active; and a control module, said control module being associated with said first and second detectors and generating a control signal to control one of said power amplifiers, said control signal being a function of one of said first and second detector signals and a reference signal, wherein said control module comprises:

a differential amplifier, said differential amplifier having a third input for receiving a reference signal and having a fourth input for one of said detection signal, and generating an error signal corresponding to a difference between said reference signal and said detection signal;

an integrator, said integrator integrating said error signal and generating an integrated error signal; and a shaping circuit, said circuit weighing said integrated error signal in accordance with characteristics of said first and second power amplifiers to generate said control signal which equalizes nonlinear amplification characteristics of said power amplifiers.

19. The transmitter of claim 18, wherein said control module further comprises a switch, said switch being controllable and feeding said control signal to one of said power amplifiers.

* * * * *

UNITED STATES PATENT AND TRADEMARK OFFICE
CERTIFICATE OF CORRECTION

PATENT NO. : 6,151,509
DATED : November 21, 2000
INVENTOR(S) : Christopher Chorey It is certified that error appears in the above-identified patent and that said Letters Patent is hereby corrected as shown below:

Column 8,
Line 12, please change "couoled to said" to -- coupled to said --.

Signed and Sealed this

Fourth Day of December, 2001

Attest:

*Nicholas P. Godici*

NICHOLAS P. GODICI
*Attesting Officer*    *Acting Director of the United States Patent and Trademark Office*